United States Patent
James et al.

(10) Patent No.: US 7,239,146 B2
(45) Date of Patent: Jul. 3, 2007

(54) INDICATOR OF REMAINING ENERGY IN STORAGE CELL OF IMPLANTABLE MEDICAL DEVICE

(75) Inventors: Kristofer J. James, Eagan, MN (US); Shawn Kelley, Coon Rapids, MN (US)

(73) Assignee: Cardiac Pacemakers, Inc., St. Paul, MN (US)

( * ) Notice: Subject to any disclaimer, the term of this patent is extended or adjusted under 35 U.S.C. 154(b) by 295 days.

(21) Appl. No.: 10/618,095

(22) Filed: Jul. 11, 2003

(65) Prior Publication Data

US 2005/0007073 A1    Jan. 13, 2005

(51) Int. Cl.
 G01N 27/416 (2006.01)
 A61N 1/00 (2006.01)
(52) U.S. Cl. .................................. 324/426; 607/29
(58) Field of Classification Search ............... 320/155, 320/139, 145; 324/426, 427; 607/29, 7, 607/9; 702/63
 See application file for complete search history.

(56) References Cited

U.S. PATENT DOCUMENTS

| | | | |
|---|---|---|---|
| 4,259,639 A | 3/1981 | Renirie | 324/430 |
| 4,276,883 A | 7/1981 | McDonald et al. | 128/419 PT |
| 4,290,429 A | 9/1981 | Blaser | 128/419 PT |
| 4,323,075 A | 4/1982 | Langer | 128/419 |
| 4,460,870 A * | 7/1984 | Finger | 324/429 |
| 4,556,061 A * | 12/1985 | Barreras et al. | 607/32 |
| 4,606,350 A | 8/1986 | Frost | 128/419 PG |
| 4,659,994 A | 4/1987 | Poljak | 324/426 |
| 4,709,202 A | 11/1987 | Koenck et al. | 320/43 |
| 4,868,908 A | 9/1989 | Pless et al. | 323/267 |
| 4,947,124 A * | 8/1990 | Hauser | 324/430 |
| 4,952,864 A | 8/1990 | Pless et al. | 323/299 |

(Continued)

FOREIGN PATENT DOCUMENTS

DE    1382978    *  5/2003

(Continued)

OTHER PUBLICATIONS

Linden David, Handbook of Batteries, 2nd edition 1994, pp. 2.1-2.25.*

(Continued)

*Primary Examiner*—Pia Tibbits
(74) *Attorney, Agent, or Firm*—Schwegman, Lundberg, Woessner & Kluth, P.A.

(57) ABSTRACT

A manganese dioxide (MnO2) or silver vanadium oxide (SVO) or other battery of an implantable medical device having a relatively flat quiescent battery voltage during a beginning portion of the battery's useful life, makes it difficult to use quiescent battery voltage as an indicator of remaining battery energy during this portion of the battery life. A substantially constant load current pulse is drawn from the battery and a pair of loaded battery terminal voltage measurements is taken during this pulse. A difference between the voltage measurements is computed. This difference can be expressed as a rate of change, a slope, or a polarization angle, and can be used with stored data from similar batteries to determine remaining energy of the battery. A quiescent battery voltage can also be used in combination with this technique, and/or for distinguishing between different remaining energies corresponding to the same difference, slope, or polarization angle.

18 Claims, 6 Drawing Sheets

U.S. PATENT DOCUMENTS

| | | | |
|---|---|---|---|
| 4,958,641 A | 9/1990 | Digby et al. | 600/515 |
| 5,083,562 A | 1/1992 | De Coriolis et al. | 128/419 |
| 5,137,021 A | 8/1992 | Wayne et al. | 128/419 PT |
| 5,184,616 A | 2/1993 | Weiss | 128/419 |
| 5,344,431 A | 9/1994 | Merritt et al. | 607/29 |
| 5,369,364 A | 11/1994 | Renirie et al. | 324/430 |
| 5,370,668 A | 12/1994 | Shelton et al. | 607/29 |
| 5,372,605 A * | 12/1994 | Adams et al. | 607/5 |
| 5,391,193 A | 2/1995 | Thompson | 607/29 |
| 5,402,070 A | 3/1995 | Shelton et al. | 324/433 |
| 5,447,522 A | 9/1995 | Chang et al. | 607/7 |
| 5,458,624 A | 10/1995 | Renirie et al. | 607/29 |
| 5,483,165 A | 1/1996 | Cameron et al. | 324/427 |
| 5,496,353 A | 3/1996 | Grandjean et al. | 607/29 |
| 5,527,630 A | 6/1996 | Nagata et al. | 429/7 |
| 5,562,595 A | 10/1996 | Neisz | 600/16 |
| 5,591,213 A | 1/1997 | Morgan | 607/5 |
| 5,596,987 A | 1/1997 | Chance | 128/633 |
| 5,675,258 A | 10/1997 | Kadouchi et al. | 324/433 |
| 5,690,685 A | 11/1997 | Kroll et al. | 607/5 |
| 5,700,280 A | 12/1997 | Silvian | 607/5 |
| 5,713,936 A | 2/1998 | Staub | 607/29 |
| 5,721,482 A | 2/1998 | Benvegar et al. | 320/43 |
| 5,741,307 A | 4/1998 | Kroll | 607/5 |
| 5,769,873 A | 6/1998 | Zadech | 607/29 |
| 5,772,689 A | 6/1998 | Kroll | 607/4 |
| 5,779,631 A | 7/1998 | Chance | 600/328 |
| 5,800,472 A | 9/1998 | Mann | 607/29 |
| 5,812,383 A | 9/1998 | Majid et al. | 363/21 |
| 5,836,973 A | 11/1998 | Kroll | 607/5 |
| 5,869,970 A | 2/1999 | Palm et al. | 324/433 |
| 5,896,423 A | 4/1999 | Okamoto | 375/345 |
| 5,897,576 A | 4/1999 | Olson et al. | 607/5 |
| 5,904,705 A | 5/1999 | Kroll et al. | 607/5 |
| 5,925,068 A | 7/1999 | Kroll | |
| 5,929,601 A | 7/1999 | Kaib et al. | 320/113 |
| 5,959,371 A | 9/1999 | Dooley et al. | 307/130 |
| 5,998,968 A * | 12/1999 | Pittman et al. | 320/130 |
| 6,016,488 A | 1/2000 | Bosworth et al. | 707/4 |
| 6,018,227 A | 1/2000 | Kumar et al. | 320/106 |
| 6,045,941 A | 4/2000 | Milewits | 429/91 |
| 6,108,579 A | 8/2000 | Snell et al. | 607/29 |
| 6,114,838 A * | 9/2000 | Brink et al. | 320/136 |
| 6,148,235 A | 11/2000 | Kuiper | 607/29 |
| 6,154,675 A | 11/2000 | Juran et al. | 607/29 |
| 6,166,524 A * | 12/2000 | Takeuchi et al. | 320/132 |
| 6,167,309 A | 12/2000 | Lyden | 607/29 |
| 6,169,387 B1 | 1/2001 | Kaib | 320/132 |
| 6,185,461 B1 | 2/2001 | Er | 607/27 |
| 6,198,253 B1 | 3/2001 | Kurle et al. | 320/132 |
| 6,274,265 B1 | 8/2001 | Kraska et al. | 429/90 |
| 6,281,683 B1 * | 8/2001 | Podrazhansky et al. | 324/432 |
| 6,307,379 B2 * | 10/2001 | Podrazhansky et al. | 324/432 |
| 6,313,609 B1 | 11/2001 | Brink | 320/132 |
| 6,366,056 B1 * | 4/2002 | Podrazhansky et al. | 320/141 |
| 6,366,809 B1 | 4/2002 | Olson et al. | 607/5 |
| 6,377,850 B1 * | 4/2002 | Takeuchi et al. | 607/2 |
| 6,426,628 B1 | 7/2002 | Palm et al. | 324/427 |
| 6,472,847 B2 | 10/2002 | Lundberg | 320/132 |
| 6,490,486 B1 | 12/2002 | Bradley | 607/28 |
| 6,503,646 B1 * | 1/2003 | Ghantous et al. | 429/3 |
| 6,563,318 B2 * | 5/2003 | Kawakami et al. | 324/426 |
| 6,584,355 B2 * | 6/2003 | Stessman | 607/29 |
| 6,671,552 B2 | 12/2003 | Merritt et al. | 607/29 |
| 6,696,842 B2 * | 2/2004 | Traub | 324/426 |
| 6,744,152 B2 | 6/2004 | Kroll | 307/66 |
| 6,760,625 B1 | 7/2004 | Kroll | 607/29 |
| 6,768,288 B2 | 7/2004 | Rosenquist et al. | 320/132 |
| 6,861,842 B2 * | 3/2005 | Baeuerlein et al. | 324/426 |
| 6,930,468 B2 * | 8/2005 | Syracuse et al. | 320/136 |
| 2003/0065366 A1 | 4/2003 | Merritt et al. | 607/27 |
| 2003/0176897 A1 | 9/2003 | Stessman | 607/27 |
| 2003/0204219 A1 | 10/2003 | Gielen | 607/45 |
| 2004/0039424 A1 | 2/2004 | Merritt, et al. | 607/29 |
| 2004/0162592 A1 | 8/2004 | Betzold et al. | 607/27 |

FOREIGN PATENT DOCUMENTS

| | | |
|---|---|---|
| EP | 0739645 A2 | 10/1996 |
| EP | 0770411 A2 | 5/1997 |
| EP | 0642369 B1 | 8/1998 |
| WO | WO-94/02202 A1 | 2/1994 |
| WO | WO-02/19448 A1 | 3/2002 |
| WO | WO-02/89904 A2 | 11/2002 |
| WO | WO-2004/062009 A2 | 7/2004 |

OTHER PUBLICATIONS

"WG Wilson Greatbatch Ltd. Reliability Evaluation Report—Model/Part No. CFx", Addendum to RER 96/169: End-of-life (EOL) characteristics for CFx cells, (Jun. 12, 1996), 1 page.

"WG Wilson Greatbatch Ltd. Reliability Evaluation Reports—Model/Part No. 9424", Subject: Model 9424 Li/CFx cell fuel gauge, (Aug. 7, 1998), 3 pages.

Krig, D. B., et al., "System and Method for Monitoring Battery Status of Implantable Medical Device", U.S. Appl. No. 10/706,856, filed Nov. 12, 2003, 24 pages.

Parsonnet, V. , "Cardiac pacing and pacemakers VII. Power sources for implantable pacemakers. Part I.", *American Heart Journal*, 94 (4), (Oct. 1977),pp. 517-528.

Ryan, J. G., "A Four Chip Implantable Defibrillator/Pacemaker Chipset", *Proceedings of the IEEE 1989 Custom Integrated Circuits Conference*, San Diego, CA,(1989),7.6.1-7.6.4.

Sherman, Don , "Measure resistance and capacitance without an A/D", *Philips Semiconductors Application Note AN449*, Philips Semiconductors, Sunnyvale, CA,(Dec. 1993),pp. 2540-2553.

Takeuchi, E. S., et al., "Energy Storage and Delivery", *In Implantable Cardioverter Defibrillators: A Comprehensive Textbook*, edited by N.A. Mark Estes III et al., (1994),123-132.

Takeuchi, E. S., et al., "Lithium/Silver Vanadium Oxide Batteries for Implantable Defibrillators", *PACE*, 11, (Nov. 1988),2035-2039.

* cited by examiner

INDICATOR OF REMAINING ENERGY IN STORAGE CELL OF IMPLANTABLE MEDICAL DEVICE

TECHNICAL FIELD

This document relates generally to energy storage cells and particularly, but not by way of limitation, to an indicator of remaining capacity of an energy storage cell, such as in an implantable pacer/defibrillator device.

BACKGROUND

Implantable medical devices include, among other things, cardiac rhythm management (CRM) devices such as pacers, cardioverters, defibrillators, cardiac resynchronization therapy (CRT) devices, as well as combination devices that provide more than one of these therapy modalities to a subject. Such devices are typically powered by self-contained energy sources, such as batteries. It is useful to know how much energy capacity remains in a battery carried within an implanted medical device, such as to ascertain when the implanted device should be explanted from the subject and replaced by a device with a fresh battery. Determining how much energy is left in a battery is particularly difficult when a measured battery characteristic (e.g., the quiescent voltage at the battery terminals) does not change appreciably during a large portion of the battery life. Yet such a characteristic is particularly desirable for use in a cardiac rhythm management device because it provides a predictable battery characteristic during that large portion of the battery life.

SUMMARY

In certain examples, this document describes a method. The method comprises drawing a substantially constant first current pulse from an energy storage cell during a first time period between a starting time and an ending time, measuring a first change of a terminal voltage across the cell during the first time period, and comparing the measured first change to first stored data to determine the energy remaining in the cell.

In certain variations, the drawing the first current pulse from the cell comprises drawing the first current pulse from a manganese dioxide battery. In certain variations, the drawing the first current pulse from the cell comprises drawing the first current pulse from a silver vanadium oxide battery. In certain variations, the drawing the first current pulse comprises drawing a substantially constant current of approximately between 2 amperes and 4 amperes. In certain variations, the drawing the first current pulse comprises drawing a substantially constant current of approximately 3 amperes. In certain variations, the first time period is approximately between 3 seconds and 30 seconds. In certain variations, the first time period is approximately 6 seconds. In certain variations, the measuring the first change comprises measuring a polarization angle. In certain variations, the measuring the first change comprises measuring a first terminal voltage across the cell just after the starting time, measuring a second terminal voltage across the cell just before the ending time, and dividing a difference between the first and second terminal voltages by a time difference between the measurements. In certain variations, the first stored data includes two different stored capacity values corresponding to a single change in terminal voltage across the cell during the first time period, and the method further comprises measuring a quiescent voltage of the cell, and comparing the measured quiescent voltage to a predetermined threshold to distinguish between the two different stored capacity values that correspond to the single change in terminal voltage across the cell. In certain variations, the method further comprises measuring a quiescent voltage of the cell, and comparing the measured quiescent voltage to second stored data to determine the energy remaining in the cell. In certain variations, the method further comprises using the measured first change to determine the energy remaining in the cell during an earlier portion of a life of the cell, and using the measured quiescent voltage to determine the energy remaining in the cell during a later portion of the life of the cell.

In certain examples, this document describes a method. The method comprises drawing a substantially constant first current pulse from an energy cell during a first time period, measuring a first change in a terminal voltage across the cell during the first time period, drawing a substantially constant second current pulse from the cell during a different second time period, measuring a second change in the terminal voltage across the cell during the second time period, and comparing the measured second change to first stored data to determine an energy remaining in the cell, including comparing the first and second changes to distinguish between two different stored capacity values that correspond to a single change in the terminal voltage across the cell.

In certain variations, the drawing the second current pulse includes drawing the second current pulse of a like magnitude and duration as the first current pulse. In certain variations, the drawing the first current pulse from the cell comprises drawing the first current pulse from a manganese dioxide battery. In certain variations, the drawing the first current pulse from the cell comprises drawing the first current pulse from a silver vanadium oxide battery. In certain variations, the measuring first and second changes comprises measuring a polarization angle. In certain variations, the method comprises measuring a quiescent voltage of the cell, and comparing the measured quiescent voltage to stored quiescent voltage data to determine the energy remaining in the cell. In certain variations, the method comprises using the measured change to determine the energy remaining in the cell during an earlier portion of a life of the cell, and using the measured quiescent voltage to determine the energy remaining in the cell during a later portion of the life of the cell.

In certain examples, this document describes a system. The system comprises: an energy storage cell; a current source/sink circuit, coupled to the cell, to draw a substantially constant first current pulse; a voltage measurement circuit, coupled to the cell, to measure first and second voltages during the first current pulse; a difference circuit, coupled to the voltage measurement circuit, to compute a difference between the first and second voltages; and a processor circuit, coupled to the difference circuit, the processor circuit including a memory circuit to store first data relating cell capacity to the difference between the first and second voltages, the memory circuit also including a cell capacity indicator storage location to provide an indication of cell capacity, the processor configured to use the difference between the first and second voltages obtained from the difference circuit and the stored first data indicative of cell capacity to provide the indication of cell capacity.

In certain variations, the energy storage cell comprises a manganese dioxide battery cell. In certain variations, the energy storage cell comprises a silver vanadium oxide cell. In certain variations, the voltage measurement circuit is also configured to measure a quiescent voltage. In certain variations, the processor is configured to compare the measured quiescent voltage to a predetermined threshold to distinguish between two different stored cell capacity values that correspond to a single difference in terminal voltage across the cell. In certain variations, the memory circuit is also configured to store second data relating cell capacity to the quiescent voltage, and in which the processor is configured to compare the measured quiescent voltage to the second data to determine the energy remaining in the cell. In certain variations, the processor is configured to determine the energy remaining in the cell using the difference, during an earlier portion of a life of the cell, and using the measured quiescent voltage, during the later portion of a life of the cell. In certain variations, the processor is configured to compare first and second differences to distinguish between two different stored first data values that correspond to a single stored difference. In certain variations, the processor is located within an implantable medical device. In certain variations, the processor is located within an external remote interface device.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

DETAILED DESCRIPTION

In the following detailed description, reference is made to the accompanying drawings which form a part hereof, and in which is shown by way of illustration specific embodiments in which the invention may be practiced. These embodiments, which are also referred to herein as "examples," are described in sufficient detail to enable those skilled in the art to practice the invention, and it is to be understood that the embodiments may be combined, or that other embodiments may be utilized and that structural, logical and electrical changes may be made without departing from the scope of the present invention. The following detailed description is, therefore, not to be taken in a limiting sense, and the scope of the present invention is defined by the appended claims and their equivalents.

In this document, the terms "a" or "an" are used, as is common in patent documents, to include one or more than one. In this document, the term "or" is used to refer to a nonexclusive or, unless otherwise indicated. Furthermore, all publications, patents, and patent documents referred to in this document are incorporated by reference herein in their entirety, as though individually incorporated by reference. In the event of inconsistent usages between this documents and those documents so incorporated by reference, the usage in the incorporated reference(s) should be considered supplementary to that of this document; for irreconcilable inconsistencies, the usage in this document controls.

Figure 1:
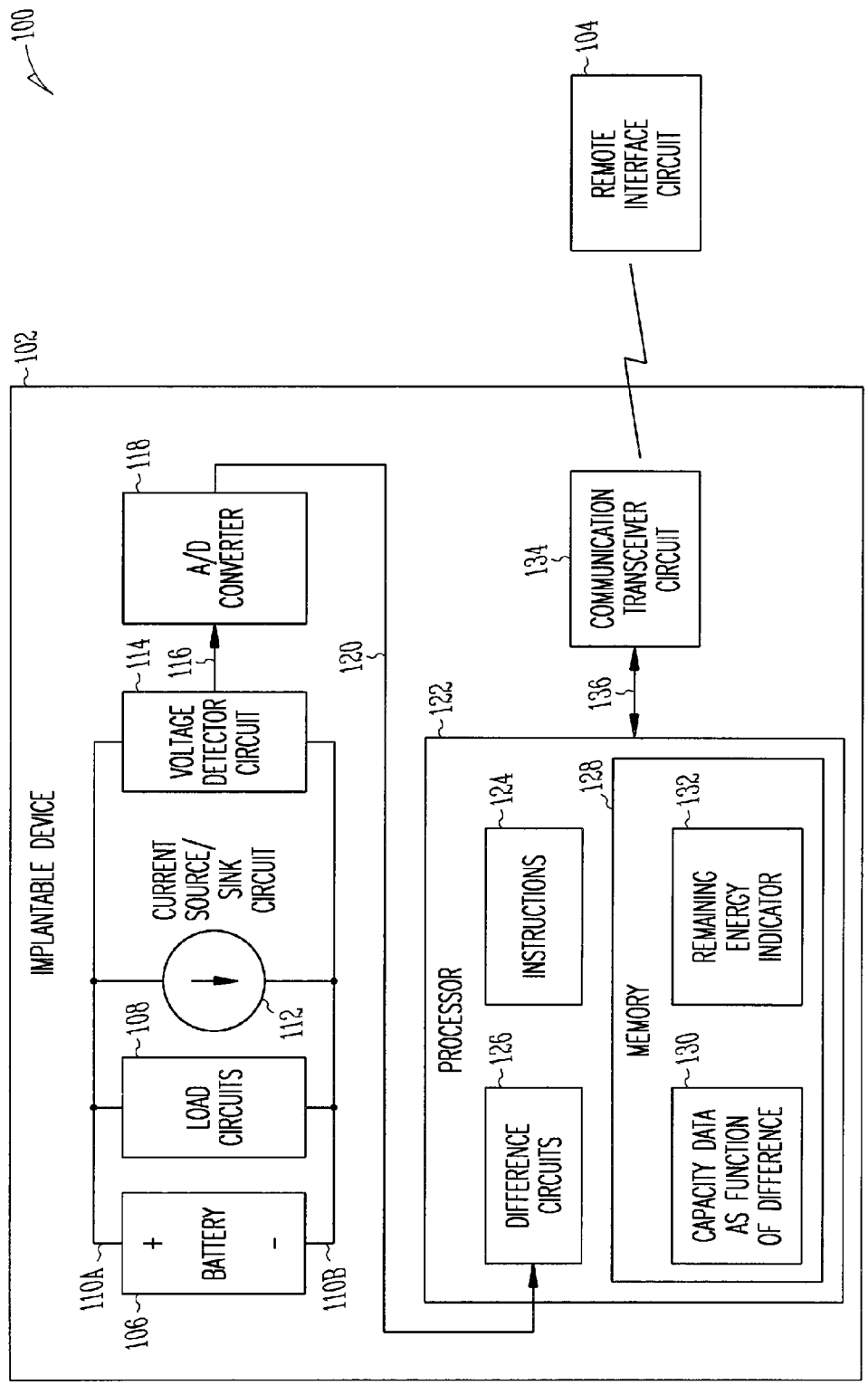
FIG. 1 is a schematic diagram illustrating generally, by way of example, but not by way of limitation, one example of a system, including an implantable device and a remote interface.

FIG. 1 is a schematic diagram illustrating generally, by way of example, but not by way of limitation, one example of a system 100. In this example, the system 100 includes an implantable device 102 and an external remote interface circuit 104. In the illustrated example, the implantable device 102 represents a cardiac rhythm management (CRM) device, and the external remote interface circuit 104 represents a remote programmer device. The device 102 includes an energy storage cell, such as a battery 106. The battery 106 provides energy to load circuits 108. For an implantable CRM device, such load circuits 108 typically include, among other things, analog circuits, a digital microprocessor circuit, a memory circuit, pacing therapy circuits, and defibrillation therapy circuits. The load circuits 108 typically draw a relatively stable quiescent current from the battery 106. One exception, however, is a charging circuit for occasionally charging one or more defibrillation energy storage capacitors to a high voltage. This stored high voltage is used for subsequently delivering a defibrillation shock to a subject. During such occasional operation, the high voltage charging circuit typically adds a substantial additional load current beyond the background quiescent current drawn by the load circuits 108.

Because the battery 106 typically has a finite energy storage capacity, there is a need to obtain an indication of how much stored energy remains in the battery 106. This battery status information is useful to a physician or other caregiver, such as for determining when the battery 106 is depleted enough to require replacing the battery 106 (or, more typically, replacing the entire implantable device 102).

This battery status information is also useful for other components of the implantable device 102. For example, near the end of the useful life of the battery 106, it may be desirable to automatically turn off one or more "nonessential" circuits to conserve energy. This preserves and prolongs the ability of other more "critical" circuits to provide therapy to the subject.

In certain circumstances, the terminal voltage (across the battery terminals 110A–B) during quiescent current draw does not vary appreciably over a significant portion of the useful life of the battery 106. This is true, for example, during a significant portion of the beginning of the useful life of the battery 106, where the battery 106 includes a manganese dioxide ($MnO_2$) battery chemistry.

The system 100 provides, among other things, devices and methods for determining the battery status, that is, the remaining energy in the battery 106. This includes a pulsed constant current source/sink circuit 112, which is connected across the battery terminals 110A–B. A voltage detector circuit is also connected across the battery terminals 110A–B, such as for measuring a battery terminal voltage one or more times during a constant current pulse drawn from the battery 106 by the current source/sink circuit 112. The voltage detector circuit 114 includes at least one output coupled, at node/bus 116, to at least one input of an analog-to-digital (A/D) converter circuit 118. The voltage detector circuit 114 outputs a voltage measurement of the battery terminal voltage. The A/D converter circuit 118 receives and digitizes this voltage measurement. At least one output of the A/D converter circuit 118 is coupled, at node/bus 120 to at least one input of a microprocessor, controller, or other processor circuit 122. The processor 122 includes stored executable instructions 124, such as for performing various operations and issuing control signals to other circuits of the implantable device 102.

The processor 122 includes a difference circuit 126, which includes at least one input that is coupled, at the node/bus 120, to the at least one output of the A/D converter circuit 118 to receive the digitized battery terminal voltage measurements. The difference circuit 126 calculates a difference between first and second voltage measurements taken (separated by a known time interval, $\Delta t$) during the constant current pulse drawn from the battery 106 by the current source/sink circuit 112. In one example, this difference is expressed as a "polarization angle," as discussed below. In another example, this difference is expressed as a "slope" or "rate of change," as discussed below. The processor 122 includes an onboard or separate memory 128. The memory 128 includes stored data 130. The stored data 130 is representative of remaining battery energy as a function of the difference between the first and second voltage measurements taken during the constant current pulse drawn from the battery 106 (or, alternatively, as a function of the "polarization angle," the "slope," or "rate of change"). As discussed below, the processor 122 executes instructions that use the difference to look up the remaining battery energy. The memory 128 includes at least one storage location 132 for storing an indicator of the remaining battery energy. In one example, the implantable device 102 further includes a telemetry or other communication transceiver circuit 134. The transceiver 134 includes at least one input that is coupled to at least one output of the processor 122, such as at a communications node/bus 136. The transceiver 134 transmits information indicative of the remaining energy indicator in the storage location 132 to the external remote interface circuit 104. Among other things, this informs the physician or other caregiver of how much useful life remains in the battery 106 before replacement of the battery 106 (or the device 102) is needed.

FIG. 1 illustrates an example in which the battery status determination is made within the implantable device 102, with the result communicated to the external remote interface circuit 104. In an alternate example, however, the processor includes instructions to control the obtaining of the first and second voltage measurements, and these first and second voltage measurements (or, alternatively, the difference between these first and second voltage measurements) are communicated by the transceiver 134 to the external remote interface circuit 104. In this example, the external remote interface circuit 104 includes instructions for performing the necessary computations for determining battery status.

Figure 2:
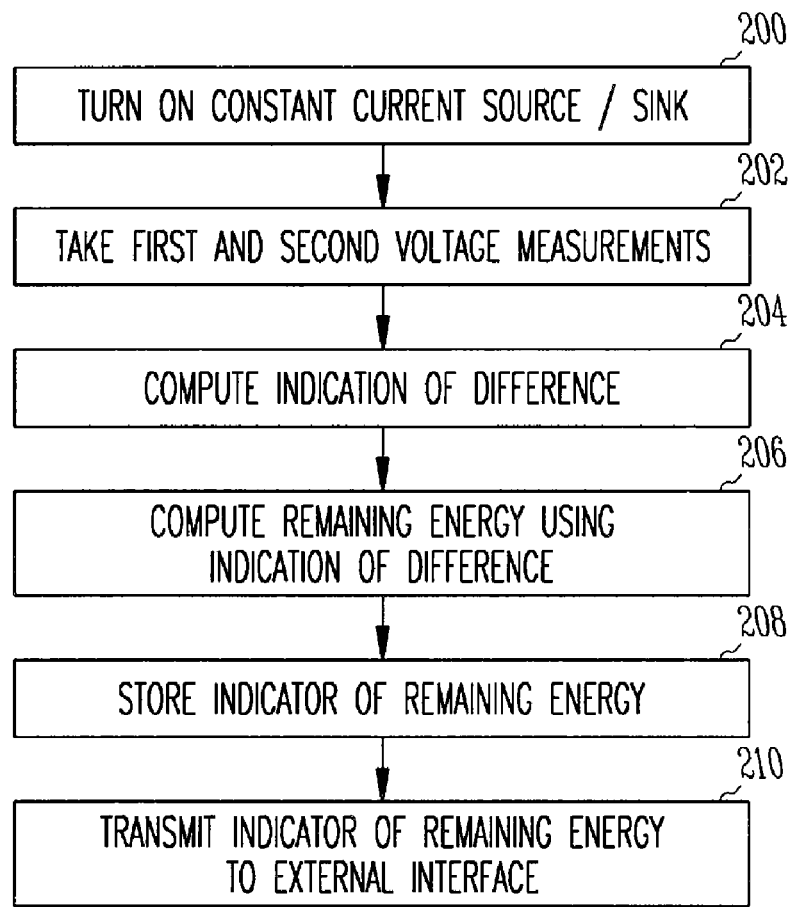
FIG. 2 is a flow chart illustrating generally, by way of example, but not by way of limitation, one example of a method of determining remaining battery capacity.

FIG. 2 is a flow chart illustrating generally, by way of example, but not by way of limitation, one example of a method of determining remaining battery capacity, such as for a $MnO_2$ battery for which the battery terminal voltage does not vary appreciably during quiescent current conditions—particularly during the beginning portion of the useful life of the battery 106. In the example of FIG. 2, at 200, the constant current source/sink 112 is turned on to draw a substantially constant current having an amplitude (in addition to the quiescent/background current drawn by the load circuits 108) of approximately between 2 amperes and 4 amperes, such as about 3 amperes. In one example, this constant current pulse is of a fixed predetermined duration that is approximately between 3 seconds and 30 seconds, such as about 6 seconds. At 202, first and second voltage measurements (separated by the known time interval, $\Delta t$) are obtained, such as by the voltage detector circuit 114, during the constant current pulse. In one example, the first voltage measurement is obtained just after the constant current pulse commences (e.g., after any initial turn-on transients stabilize), and the second voltage measurement is obtained just before the constant current pulse ceases. At 204, an indication of the difference between the first and second voltage measurements is computed, such as by the difference circuit 126. This indication of the difference may, but need not, be expressed as a slope or rate of change of the battery terminal voltage during the constant current pulse, or as a "polarization angle," as discussed below. At 206, the indication of the difference is used to compute the remaining energy of the battery 106. At 208, an indication of the remaining energy of the battery 106 is stored in the memory location 132. At 210, information indicative of the remaining energy of the battery 106 is communicated from the implantable device 102, such as from the transceiver 134 to the external remote interface circuit 104, to be displayed to a physician or other caregiver.

Figure 3:
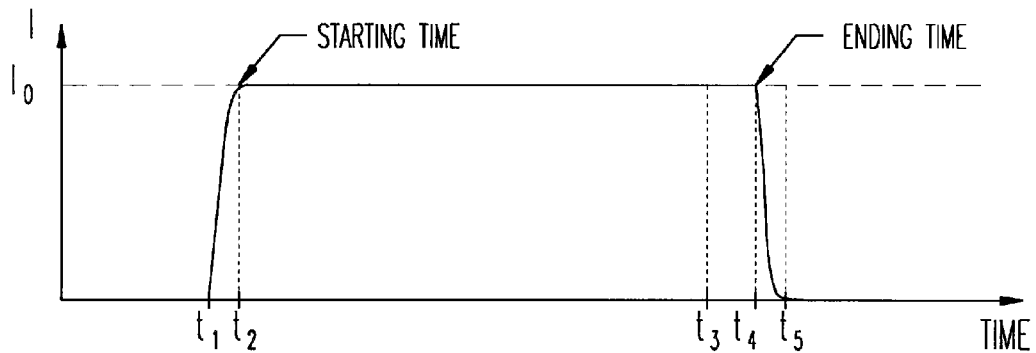
FIG. 3 is a current vs. time graph illustrating generally one example of a substantially constant current pulse drawn from the battery.

FIG. 3 is a current vs. time graph illustrating generally one example of a substantially constant current pulse drawn from the battery 106, such as by the current source/sink circuit 112. The current pulse is turned on at time $t_1$, and reaches its full amplitude $I_o$ by time $t_2$. This current amplitude $I_o$ is in addition to any quiescent/background current being drawn from the battery 106, such as by the load circuits 108. The amplitude remains stable at $I_o$ at time $t_3$, just before the current pulse is turned off at $t_4$. The amplitude returns to zero at time $t_5$.

Figure 4:
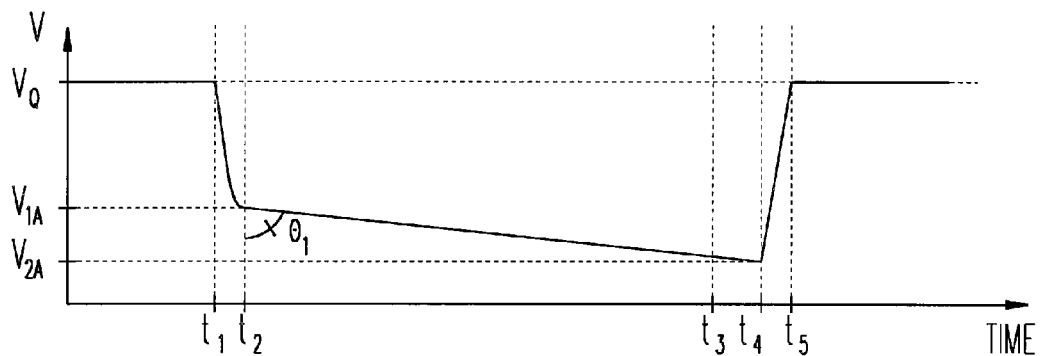
FIG. 4 is a corresponding voltage vs. time graph, illustrating generally one example of a battery terminal voltage signal during the substantially constant current pulse of FIG. 3.

FIG. 4 is a corresponding voltage vs. time graph illustrating generally one example of a battery terminal voltage signal during the substantially constant current pulse of FIG. 3. Initially, the battery terminal voltage is at a background or quiescent voltage $V_Q$. At time $t_1$, when the current pulse is turned on, the battery terminal voltage begins to drop until it reaches the first loaded voltage $V_{1B}$ at time $t_2$. During the substantially constant current pulse, the battery terminal voltage continues to drop slightly until it reaches the second loaded voltage $V_{2B}$ at the time $t_4$. At that time, the substantially constant current pulse is turned off, and the battery terminal voltage returns to the quiescent voltage $V_Q$ at time $t_5$. FIG. 4 illustrates a conceptual example for which the battery 106 is near the beginning of its useful life.

Figure 5:
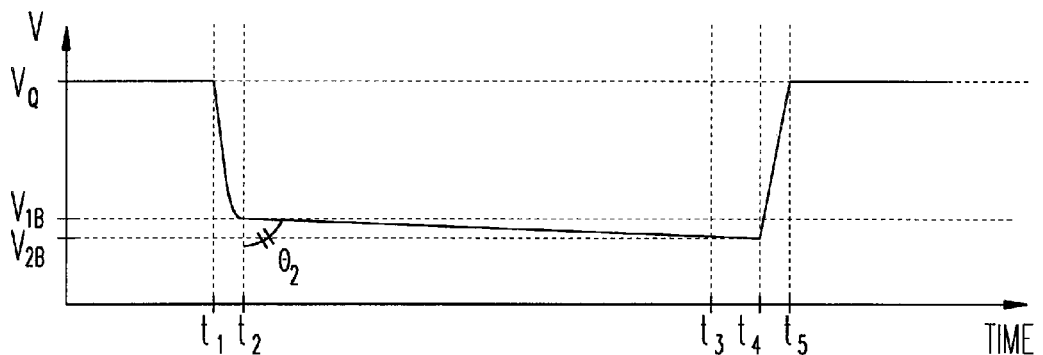
FIG. 5 is a voltage vs. time graph, similar to FIG. 4, but illustrating a conceptual example for which the battery is near the middle of its useful life.

FIG. 5 is a voltage vs. time graph, similar to FIG. 4, but illustrating a conceptual example for which the battery 106 is near the middle of its useful life. Comparing FIGS. 4–5, the battery terminal voltage drops, between times $t_2$ and $t_4$, more quickly when the battery 106 is near the beginning of its useful life (see FIG. 4) than when the battery 106 is near the middle of its useful life (see FIG. 5). This rate of change, or "slope," therefore, provides a useful indicator of the energy remaining in the battery 106. The slope can alternatively be expressed as a polarization angle θ, as illustrated in FIGS. 4–5. The polarization angle $\theta = \tan^{-1}(\Delta t/\Delta v)$, where $\Delta t$ is a time difference and $\Delta v$ is a corresponding voltage difference. FIGS. 4–5 illustrate $\theta_1$ (for the beginning of the useful life of the battery 106) as being less than $\theta_2$ (for the middle of the useful life of the battery 106.

Figure 6:
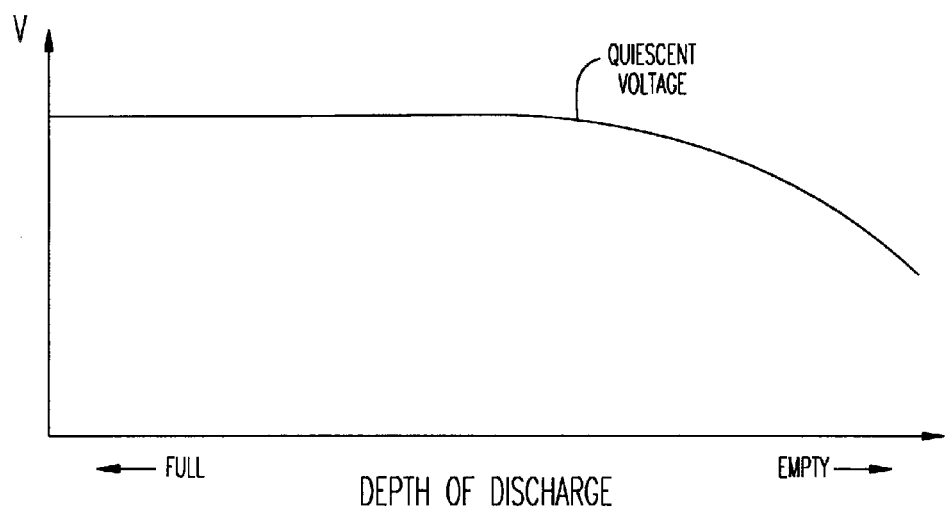
FIG. 6 is a conceptualized voltage vs. time graph of quiescent battery terminal voltage vs. depth of discharge of a $MnO_2$ battery.

FIG. 6 is a conceptualized voltage vs. time graph of quiescent battery terminal voltage vs. depth of discharge of a $MnO_2$ battery 106. As seen in FIG. 6, the quiescent battery terminal voltage does not vary appreciably during a beginning portion of the $MnO_2$ battery life, when the battery is relatively full of stored energy. This makes quiescent battery terminal voltage difficult to use for determining the battery's stored energy status during the beginning portion of the $MnO_2$ battery's useful life.

Figure 7:
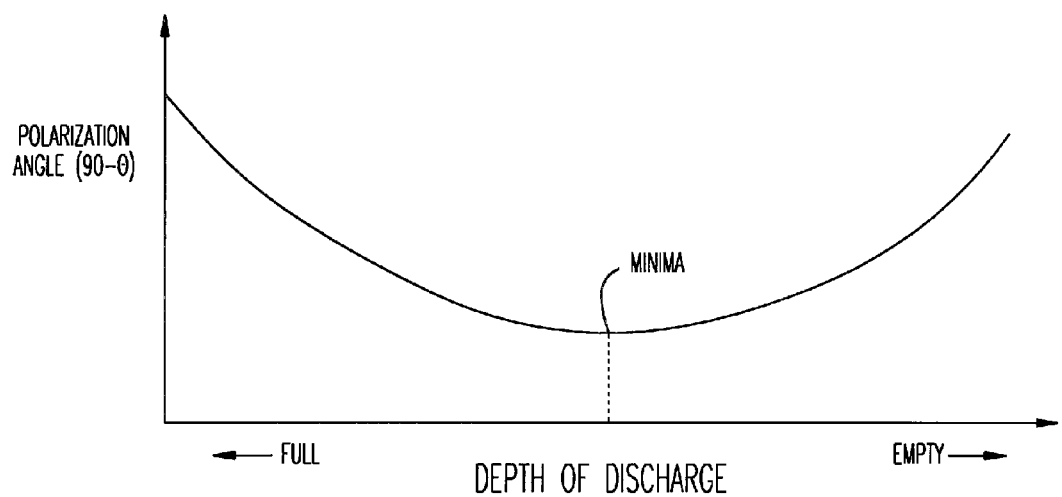
FIG. 7 is a conceptualized graph of a polarization angle (i.e., 90-θ), representing the slope of the battery terminal voltage during the constant current pulse of FIG. 3 vs. depth of discharge of a $MnO_2$ battery.

FIG. 7 is a conceptualized graph of a polarization angle (i.e., 90–θ), representing the slope of the battery terminal voltage during the constant current pulse, such as between times $t_2$ and $t_3$ or between times $t_2$ and $t_4$. As seen in FIG. 7, the polarization angle changes significantly during the beginning portion of the $MnO_2$ battery life, when the battery is relatively full of stored energy. This makes such slope or polarization angle a useful indicator for determining the battery's stored energy status, particularly during the beginning portion of the $MnO_2$ battery's useful life. By measuring the battery terminal voltage at two times during the constant current pulse, taking the difference between these measurements, and dividing by the time difference, $\Delta t$, between these two battery terminal voltage measurements, the angle θ is obtained. The polarization angle quantity (90–θ), where θ is expressed in degrees, is compared to a lookup table or equation fit (from data previously obtained from similar batteries) of remaining battery energy vs. (90–θ). This permits the remaining battery energy to be determined.

However, as seen in FIG. 7, the "bathtub" shaped curve of polarization angle vs. depth of discharge maps one value of the polarization angle to two different values of remaining battery energy. The present inventors have recognized several techniques for overcoming this potentially confounding factor. First, the polarization angle can be used to determine remaining battery energy during a beginning portion of the battery's useful life, then switching to use the quiescent battery terminal voltage to determine remaining battery energy during a later portion of the battery life, as discussed below with respect to FIG. 8. Second, the curve of FIG. 7 can be divided up into a beginning of life segment and an end of life segment, and the polarization angle or remaining energy can be used to switch between the two segments, such as discussed below with respect to FIG. 9. Third, the curve of FIG. 7 can be divided up into the beginning of life and end of life segments, and a quiescent battery terminal voltage can be used to switch between the two segments, such as discussed below with respect to FIG. 10.

Figure 8:
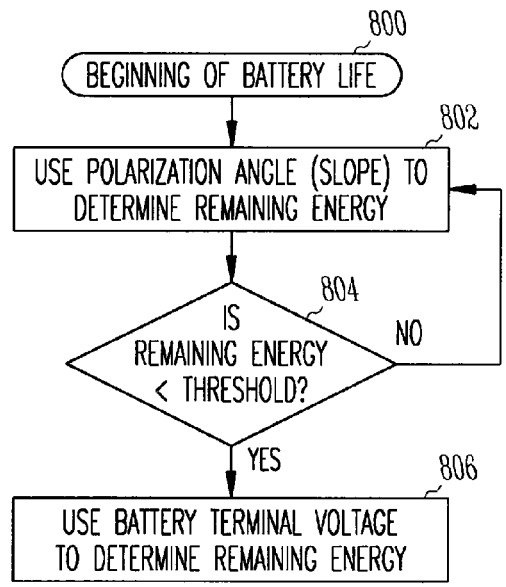
FIG. 8 is a flow chart illustrating generally one example of a technique that uses both polarization angle (or the slope, or similar indication using the difference between the two battery terminal voltage measurements obtained during the constant current pulse) and quiescent battery terminal voltage (obtained at a time other than during the constant current pulse) for determining the remaining energy in a $MnO_2$ battery.

FIG. 8 is a flow chart illustrating generally one example of a technique that uses both polarization angle (or the slope, or similar indication using the difference between the two battery terminal voltage measurements obtained during the constant current pulse) and quiescent battery terminal voltage (obtained at a time other than during the constant current pulse) for determining the remaining energy in the $MnO_2$ battery. At 800, upon implantation of the device 102, it is the beginning of the battery's useful life. At 802, the polarization angle (or the slope, or similar indication using the difference between the two battery terminal voltage measurements obtained during the constant current pulse) is used to determine the remaining energy, such as discussed above with respect to FIG. 2. At 804, the resulting remaining battery energy is compared to a threshold (e.g., corresponding to the minima of the curve of FIG. 7). If the remaining energy exceeds the threshold, then process flow returns to 802—remaining battery energy continues to be computed using polarization angle. However, if at 804 the remaining energy is less than the threshold, then subsequently, battery terminal voltage is measured under quiescent current conditions and used to determine remaining energy, at 806. This includes comparing the measured quiescent battery terminal voltage to a lookup table of remaining energy vs. quiescent battery terminal voltage. As seen in the curve of FIG. 6, during this portion of the battery life, quiescent battery terminal voltage changes more appreciably as a function of remaining battery energy. Therefore, quiescent battery terminal voltage provides a more useful indicator of remaining battery indicator during this latter portion of the battery's useful life than during the earlier portion of the battery's useful life, when the curve is relatively flat.

Figure 9:
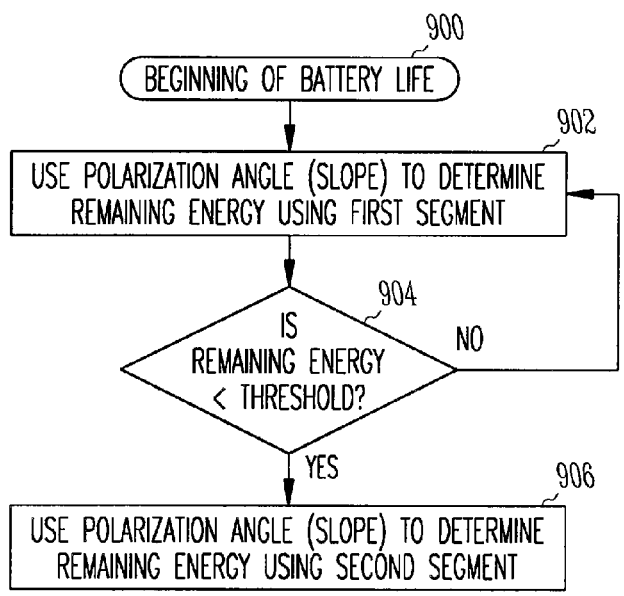
FIG. 9 is a flow chart illustrating generally a technique that splits the curve of FIG. 7 into a beginning of life segment that precedes the minima, and an end of life portion that succeeds the minima, and that uses remaining energy to switch between the two segments.

FIG. 9 is a flow chart illustrating generally a technique that splits the curve of FIG. 7 into a beginning of life segment that precedes the minima, and an end of life portion that succeeds the minima, and that uses remaining energy to switch between the two segments. At 900, when the device 102 is initially implanted, the $MnO_2$ battery is at the beginning of its useful life. At 902, the polarization angle (or the slope, or similar indication using the difference between the two battery terminal voltage measurements obtained during the constant current pulse) is used to determine the remaining energy, such as discussed above with respect to FIG. 2, using the beginning of life segment of the curve of FIG. 7. At 904, the resulting remaining battery energy is compared to a threshold (e.g., corresponding to the minima of the curve of FIG. 7). If the remaining energy exceeds the threshold, then process flow returns to 902—remaining battery energy continues to be computed using polarization angle and the beginning of life segment of the curve of FIG. 7. However, if at 904 the remaining energy is less than the threshold, then subsequently, remaining battery energy is subsequently computed at 906 using polarization angle and the end of life segment of the curve of FIG. 7. At 904, as an alternative to comparing remaining energy to a threshold, the corresponding polarization angle can be compared to a corresponding threshold (e.g., corresponding to the minima of the bathtub curve of FIG. 7).

Figure 10:
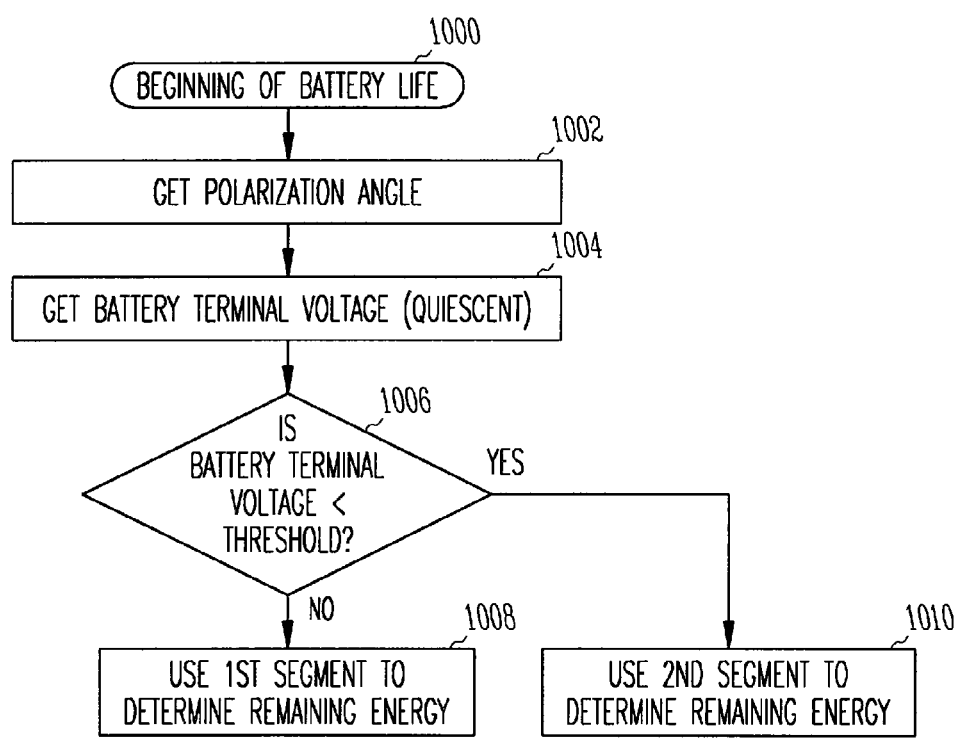
FIG. 10 is a flow chart illustrating generally another technique that splits the curve of FIG. 7 into a beginning of life segment that precedes the minima, and an end of life portion that succeeds the minima, and that uses a determination of quiescent battery voltage to switch between the two segments.

FIG. 10 is a flow chart illustrating generally another technique that splits the curve of FIG. 7 into a beginning of life segment that precedes the minima, and an end of life portion that succeeds the minima, and that uses a determination of quiescent battery voltage to switch between the two segments. At 1000, when the device 102 is initially implanted, the MnO2 battery is at the beginning of its useful life. At 1002, the polarization angle (or the slope, or similar indication using the difference between the two battery terminal voltage measurements obtained during the constant current pulse) is obtained for determining the remaining energy, such as discussed above with respect to FIG. 2. At 1004, a quiescent battery terminal voltage measurement is obtained. At 1006, the quiescent battery terminal voltage is compared to a threshold value (e.g., corresponding to the minima of the curve of FIG. 7). If the threshold quiescent battery terminal voltage measurement is greater than or equal to the threshold value, then the first (beginning of life) segment of the curve of FIG. 7 is used to determine remaining battery energy at 1008. Otherwise, at 1010, the second (end of life) segment of the curve of FIG. 7 is used to determine the remaining battery energy.

Although the above examples have been described for an example using an $MnO_2$ battery chemistry, the present devices and methods will also be useful for determining battery status for batteries of other chemistries such as, for example, a silver vanadium oxide (SVO) battery chemistry. For example, for a SVO battery chemistry, the above-described techniques using polarization angle to determine remaining battery life may require that the SVO battery not be discharged too quickly, thereby diminishing the polarization angle effect from which remaining battery life is determined. Also, although the above-described techniques are particularly useful for batteries where the quiescent battery terminal voltage does not vary appreciably over the usable life of the body, such techniques are not limited to use with such batteries, but can be used with other batteries as well.

It is to be understood that the above description is intended to be illustrative, and not restrictive. For example, the above-described embodiments may be used in combination with each other. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects.

What is claimed is:

1. A method comprising:
    drawing a substantially constant first current pulse from an energy storage cell during a first time period between a starting time and an ending time;
    measuring a first change of a terminal voltage across the cell during the first time period, in which the measuring the first change of the terminal voltage comprises measuring a polarization angle; and
    comparing the measured first change to first stored data to determine the energy remaining in the cell.

2. The method of claim 1, in which the drawing the first current pulse from the cell comprises drawing the first current pulse from a manganese dioxide battery.

3. The method of claim 1, in which the drawing the first current pulse from the cell comprises drawing the first current pulse from a silver vanadium oxide battery.

4. The method of claim 1, in which the drawing the first current pulse comprises drawing a substantially constant current of approximately between 2 amperes and 4 amperes.

5. The method of claim 4, in which the drawing the first current pulse comprises drawing a substantially constant current of approximately 3 amperes.

6. The method of claim 1, in which the first time period is approximately between 3 seconds and 30 seconds.

7. The method of claim 6, in which the first time period is approximately 6 seconds.

8. The method of claim 1, in which the measuring the first change comprises:
    measuring a first terminal voltage across the cell just after the starting time;
    measuring a second terminal voltage across the cell just before the ending time; and
    dividing a difference between the first and second terminal voltages by a time difference between the measurements.

9. The method of claim 1, in which the first stored data includes two different stored capacity values corresponding to a single change in terminal voltage across the cell during the first time period, and further comprising:
    measuring a quiescent voltage of the cell; and
    comparing the measured quiescent voltage to a predetermined threshold to distinguish between the two different stored capacity values that correspond to the single change in terminal voltage across the cell.

10. The method of claim 1, further comprising:
    measuring a quiescent voltage of the cell; and
    comparing the measured quiescent voltage to second stored data to determine the energy remaining in the cell.

11. The method of claim 10, further comprising: using the measured first change to determine the energy remaining in the cell during an earlier portion of a life of the cell; and
    using the measured quiescent voltage to determine the energy remaining in the cell during an earlier portion of the life of the cell.

12. A method comprising:
    drawing a substantially constant first current pulse from an energy cell during a first time period;
    measuring a first change in a terminal voltage across the cell during the first time period;
    drawing a substantially constant second current pulse from the cell during a different, second time period;
    measuring a second change in the terminal voltage across the cell during the second time period, in which the measuring first and second changes in the terminal voltage comprises measuring a polarization angle; and
    comparing the measured second change to first stored data to determine an energy remaining in the cell, including comparing the first and second changes to distinguish between two different stored capacity values that correspond to a single change in the terminal voltage across the cell.

13. The method of claim 12, in which the drawing the second current pulse includes drawing the second current pulse of a like magnitude and duration as the first current pulse.

14. The method of claim 12, in which the drawing the first current pulse from the cell comprises drawing the first current pulse from a manganese dioxide battery.

15. The method of claim 12, in which the drawing the first current pulse from the cell comprises drawing the first current pulse from a silver vanadium oxide battery.

16. The method of claim 12, further comprising:

measuring a quiescent voltage of the cell; and comparing the measured quiescent voltage to stored quiescent voltage data to determine the energy remaining in the cell.

17. The method of claim 16, further comprising:

using the measured change to determine the energy remaining in the cell during an earlier portion of a life of the cell; and using the measured quiescent voltage to determine the energy remaining in the cell during a later portion of the life of the cell.

18. A system comprising:

means for drawing a substantially constant first current pulse from an energy storage cell during a first time period between a starting time and an ending time;

means for measuring a first change of a terminal voltage across the cell during the first time period, in which the measuring the first change of the terminal voltage comprises measuring a polarization angle; and means for comparing the measured first change to first stored data to determine the energy remaining in the cell.

* * * * *

UNITED STATES PATENT AND TRADEMARK OFFICE
CERTIFICATE OF CORRECTION

PATENT NO. : 7,239,146 B2 Page 1 of 1
APPLICATION NO. : 10/618095
DATED : July 3, 2007
INVENTOR(S) : James et al.

It is certified that error appears in the above-identified patent and that said Letters Patent is hereby corrected as shown below:

On the Title page, in field (57), under "Abstract", in column 2, line 1, delete "(MnO2)" and insert -- $(MnO_2)$ --, therefor.

In column 10, line 5, in Claim 6, delete "3seconds" and insert -- 3 seconds --, therefor.

In column 10, line 37, in Claim 11, delete "an earlier" and insert -- a later --, therefor.

Signed and Sealed this

Sixteenth Day of October, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,239,146 B2 | |
| APPLICATION NO. | : 10/618095 | |
| DATED | : July 3, 2007 | |
| INVENTOR(S) | : James et al. | |

It is certified that error appears in the above-identified patent and that said Letters Patent is hereby corrected as shown below:

In column 11, line 13, below "the cell."
insert -- 18. A system comprising:
an energy storage cell;
a current source/sink circuit, coupled to the cell, to draw a substantially constant first current pulse;
a voltage measurement circuit, coupled to the cell, to measure first and second voltages during the first current pulse;
means for measuring a first change of a terminal voltage across the cell during the first time period, in which the measuring the first change of the terminal voltage comprises measuring a polarization angle;
a difference circuit, coupled to the voltage measurement circuit, to compute a difference between the first and second voltages; and
a processor circuit, coupled to or including the difference circuit, the processor circuit including a memory circuit to store first data relating cell capacity to the difference between the first and second voltages, the memory circuit also including a cell capacity indicator storage location to provide an indication of cell capacity, the processor configured to use the difference between the first and second voltages obtained from the difference circuit and the polarization angle and the stored first data indicative of cell capacity to provide the indication of cell capacity. --

In column 12, line 1, in claim 18, delete "18." and insert -- 28. --, therefor.

Col. 12    lines 1-2        Should read
-- 19. The system of claim 18, in which the energy storage cell comprises a manganese dioxide battery cell. --

Col. 12    lines 3-4        Should read
-- 20. The system of claim 18, in which the energy storage cell comprises a silver vanadium oxide cell. --

Col. 12    lines 5-6        Should read
-- 21. The system of claim 18, in which the voltage measurement circuit is also configured to measure a quiescent voltage. --

Col. 12    lines 7-8        Should read
-- 22. The system of claim 21, in which the processor is configured to compare the measured quiescent voltage to a predetermined threshold to distinguish between two different stored cell capacity values that correspond to a single difference in terminal voltage across the cell. --

UNITED STATES PATENT AND TRADEMARK OFFICE
CERTIFICATE OF CORRECTION

PATENT NO. : 7,239,146 B2
APPLICATION NO. : 10/618095
DATED : July 3, 2007
INVENTOR(S) : James et al.

It is certified that error appears in the above-identified patent and that said Letters Patent is hereby corrected as shown below:

Col. 12    lines 9-10        Should read
-- 23. The system of claim 21, in which the memory circuit is also configured to store second data relating cell capacity to the quiescent voltage, and in which the processor is configured to compare the measured quiescent voltage to the second data to determine the energy remaining in the cell. --

Col. 12    lines 11-13        Should read
-- 24. The system of claim 23, in which the processor is configured to determine the energy remaining in the cell using the difference, during an earlier portion of a life of the cell, and using the measured quiescent voltage, during the later portion of a life of the cell. --

Col. 13    lines 1-3        Should read
-- 25. The system of claim 18, in which the processor is configured to compare first and second differences to distinguish between two different stored first data values that correspond to a single stored difference. --

Col. 13    line 4        Should read
-- 26. The system of claim 18, in which the processor is located within an implantable medical device. --

Col. 13    line 5        Should read
-- 27. The system of claim 18, in which the processor is located within an external remote interface device. --

Signed and Sealed this

Twenty Second Day of April, 2008

JON W. DUDAS
*Director of the United States Patent and Trademark Office*